(12) United States Patent
Louie et al.

(10) Patent No.: US 6,262,920 B1
(45) Date of Patent: Jul. 17, 2001

(54) PROGRAM LATCH WITH CHARGE SHARING IMMUNITY

(75) Inventors: Benjamin Louie, Sunnyvale; Asim Bajwa, San Jose, both of CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/382,347

(22) Filed: Aug. 25, 1999

(51) Int. Cl.$^7$ .................................................. G11C 16/04
(52) U.S. Cl. ................ 365/189.05; 365/230.08; 365/185.25
(58) Field of Search .................... 365/189.05, 230.08, 365/185.25

(56) References Cited

U.S. PATENT DOCUMENTS

| | | | |
|---|---|---|---|
| 4,766,572 | * 8/1988 | Kobayashi | 365/190 |
| 5,146,427 | * 9/1992 | Sasaki et al. | 365/189.05 |
| 5,355,347 | * 10/1994 | Cioaca | 365/230.08 |
| 5,465,232 | 11/1995 | Ong et al. | 365/189 |
| 5,732,036 | 3/1998 | Merritt et al. | 365/203 |
| 5,835,441 | * 11/1998 | Seyyedy et al. | 365/230.06 |
| 5,877,987 | 3/1999 | Merritt | 365/189.05 |
| 5,986,944 | 11/1999 | Merritt | 635/189.05 |

OTHER PUBLICATIONS

"2 MEG × 8 Even–Sectored Flash Memory", *1998 Flash Memory Data Book*, Micron Quantum Devices, Inc., 2–25 to 2–33, (1998).

"4MB–15MB CompactFlash", *1998 Flash Memory Data Book*, Micron Quantum Devices, Inc., 3–1 to 3–3, (1998).

* cited by examiner

*Primary Examiner*—Richard Elms
*Assistant Examiner*—Tuan T. Nguyen
(74) *Attorney, Agent, or Firm*—Schwegman, Lundberg, Woessner & Kluth, P.A.

(57) ABSTRACT

A method and apparatus for loading portions of a bank of program latches in parallel while providing charge sharing immunity is described. A latch is bypassed while it is loaded, thereby coupling the input to the output, so that any capacitance on the output is charged. In later load operations, when the input to the latch is not driven with data, but is rather left to float, the output is again coupled to the input so that the charged capacitance on the output keeps the input from changing state. The program latches can be used as part of a memory device, to hold data on shared bitlines in columns of a memory array while the array is programmed. The program latches are controlled by a latch load signal and a latch bypass signal, both of which are fanned out across the bank of program latches.

32 Claims, 7 Drawing Sheets

PROGRAM LATCH WITH CHARGE SHARING IMMUNITY

TECHNICAL FIELD OF THE INVENTION

The present invention relates generally to latches used in processing systems, and in particular, the present invention relates to program latches in memory devices.

BACKGROUND OF THE INVENTION

Non-volatile memories are extensively used for storing data in processing systems. Examples include erasable programmable read-only memories (EPROM), electrically erasable programmable read-only memories (EEPROM), and Flash memory. These memories are typically internally arranged such that memory cells form arrays consisting of rows and columns. The rows and columns have decode blocks associated therewith, so that any one cell can be uniquely specified.

For programming purposes, non-volatile memories generally have bitlines for carrying data through the array in one dimension. For example, a common technique in memory design is to have bitlines traverse the array in the "Y" direction, such that each cell in a column shares the same bitline during programming. The bitlines are commonly driven during programming by program latches which have been loaded with the desired data prior to programming the memory cells. The number of program latches generally corresponds to the number of columns in the array.

Program latches are generally loaded a subset at a time, with the size of the subset being constrained by the width of the data bus external to the integrated circuit. For example, in a typical device having an 8 bit wide external data bus, but having 256 program latches internal to the device, 32 load operations of 8 bits each are required to load all 256 program latches prior to a programming operation. One well known method of loading a subset of the latches is to provide decoding circuitry that selects the subset to be loaded and de-selects the subset not to be loaded, thereby only asserting control signals corresponding to the set to be loaded. This decoding circuitry consumes space on the integrated circuit.

It is desirable to minimize the size of the program latches in part because when less space is consumed by the latches, more space is available for other circuitry for any given die size. One recognized method of reducing the size of program latches is to do away with the decoding circuitry so that all program latches receive the same "load" signal, and then only driving the input data lines of the data latches to be loaded, and to let the remaining data input lines float. This approach, however, creates a new set of problems, including the problem that the capacitance of the floating data input lines can present a substantial load to the inputs of the latches not intended for loading. If the capacitive load is great enough, charge is "shared" between the capacitive load on the input data line and the input of the latch to the extent that the logic sense of the latch input can be upset, thereby modifying the latch contents in error. This "charge sharing" is undesirable.

For the reasons stated above, and for other reasons stated be low which will become apparent to those skilled in the art up on reading and understanding the present specification, there is a need in the art for a method and apparatus to provide immunity from charge sharing in latch designs.

SUMMARY OF THE INVENTION

The above mentioned problems with charge sharing and other problems are addressed by the present invention and will be understood by reading and studying the following specification.

In one embodiment, an integrated circuit is described which includes a latch with a capacitive output load, and a latch bypass path coupled to the input of the latch and to the output of the latch which operates to charge the capacitive load on the output. In another embodiment an integrated circuit is described which includes a plurality of latches responsive to a latch load signal, where each of the of latches includes a storage element and a latch load transistor coupled to the input of the storage element, where each of the latch load transistors is responsive to the same latch load signal.

In yet another embodiment, a memory device having memory cells arranged in columns is described. Each of the cells in a column is connected to a shared bitline having a bitline capacitance. The memory device also includes a plurality of program latches, each having an output coupled to a separate shared bitline. Each program latch in turn includes a storage element and a bypass element coupled between the input and the output of the program latch. A processing system which includes the aforementioned memory device is also described.

A method of operating a latch which has a capacitive input load and a capacitive output load is also described. The method includes coupling a storage element within the latch to the capacitive input load, and coupling the capacitive input load to the capacitive output load. A method of loading a subset of a plurality of latches is also described. Each latch has a capacitive output load, and each is conditionally coupled to a separate data input, which may or may not be driven. The method includes coupling the plurality of latches to their respective data inputs, coupling the capacitive output load of each of the plurality of latches to their respective data inputs, and driving with data the data inputs corresponding to the set of latches to be loaded.

DETAILED DESCRIPTION OF THE INVENTION

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

The program latches described herein provide for charge sharing immunity which allows a latch to maintain its state when a "load" command is given and the latch input is floating. The latches are controlled by a common "latch load" signal, such that latches having inputs driven with data are loaded, and latches with floating inputs are not loaded. During a load operation, the latch receives the latch load signal, the input of the latch is driven with data, and the latch is bypassed so that the input data also charges the bitline on the output. When other latches are subsequently loaded, the previously loaded latch has a floating input, and the previously loaded latch receives the latch load signal and is again bypassed so that the shared bitline, with its charged capacitance, is coupled to the floating input, thereby providing charge sharing immunity. One type of integrated circuit which is well suited to benefit from the program latches is an integrated memory device. The memory device can be any configuration, including but not limited to DRAM, SRAM, EEPROM, and Flash EPROM. Prior to describing the program latches, a brief description is provided of a Flash memory which can incorporate program latches.

Flash Memory

Figure 1A:
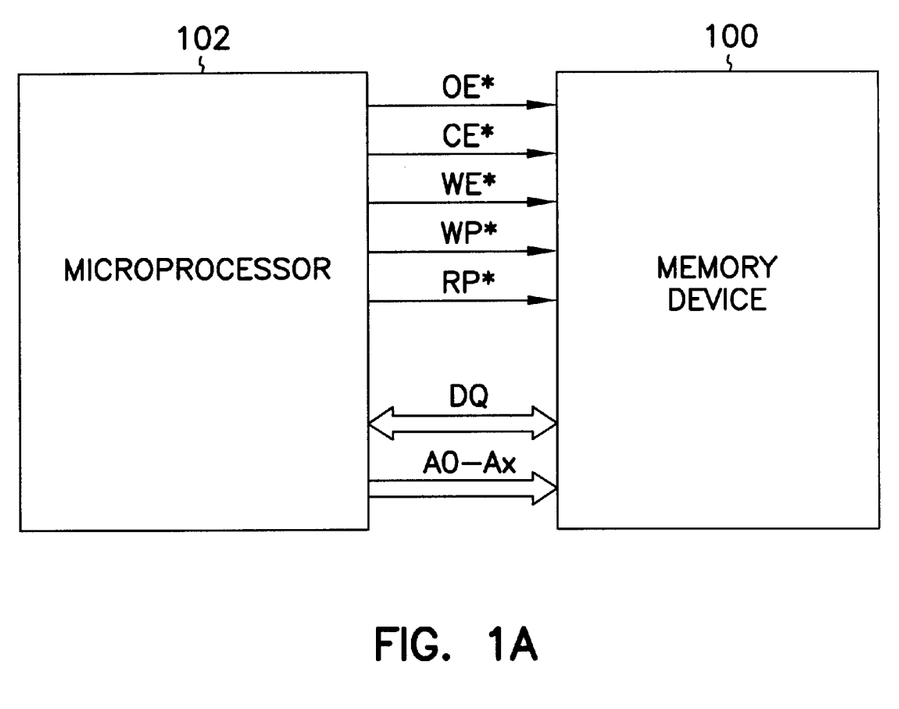
FIG. 1A is a block diagram of a flash memory system.

FIG. 1A illustrates a block diagram of a basic Flash memory device 100 which is coupled to a microprocessor, or memory controller 102. The memory device has been simplified to focus on features of the memory which are helpful in understanding the present invention. The memory device 100 includes an array of non-volatile memory cells 104, FIG. 1B. The memory cells are preferably floating gate memory cells. The array is arranged in rows and columns, with the rows arranged in blocks. The blocks allow memory cells to be erased in blocks. Data, however, is stored in the memory array separate from the block structure. Erase operations, therefore, are performed much faster.

An x-decoder 108 and a y-decoder 110 are provided to decode address signals provided on address lines A0-Ax 112. An address buffer circuit 106 is provided to latch the address signals. Address signals are received and decoded to access the memory array 104. A y-select circuit 116 is provided to select one or more columns of the array identified with the y-decoder 110. Also included with y-select circuit 116 are program latches which hold data to be programmed into the memory array. Sense amplifier and compare circuitry 118 is used to sense data stored in the memory cells and verify the accuracy of stored data. Data input 120 and output 122 buffer circuits are included for bi-directional data communication over a plurality of data (DQ) lines with the microprocessor 102. Command control circuit 114 decodes signals provided on control lines from the microprocessor. These signals are used to control the operations of the memory, including data read, data write, and erase operations. Input/output control circuit 124 is used to control the input and output buffers in response to some of the control signals. The memory includes internal circuitry in command control circuit 114 for generating timing signals. As stated above, the Flash memory of FIG. 1A has been simplified to facilitate a basic understanding of the features of the memory. A more detailed understanding of Flash memories is known to those skilled in the art. See "1998 Flash Memory Data Book" pages 2-5 to 2-33 available from Micron Quantum Devices, Inc. (incorporated herein by reference) for a more detailed description of a Flash memory.

Figure 1B:
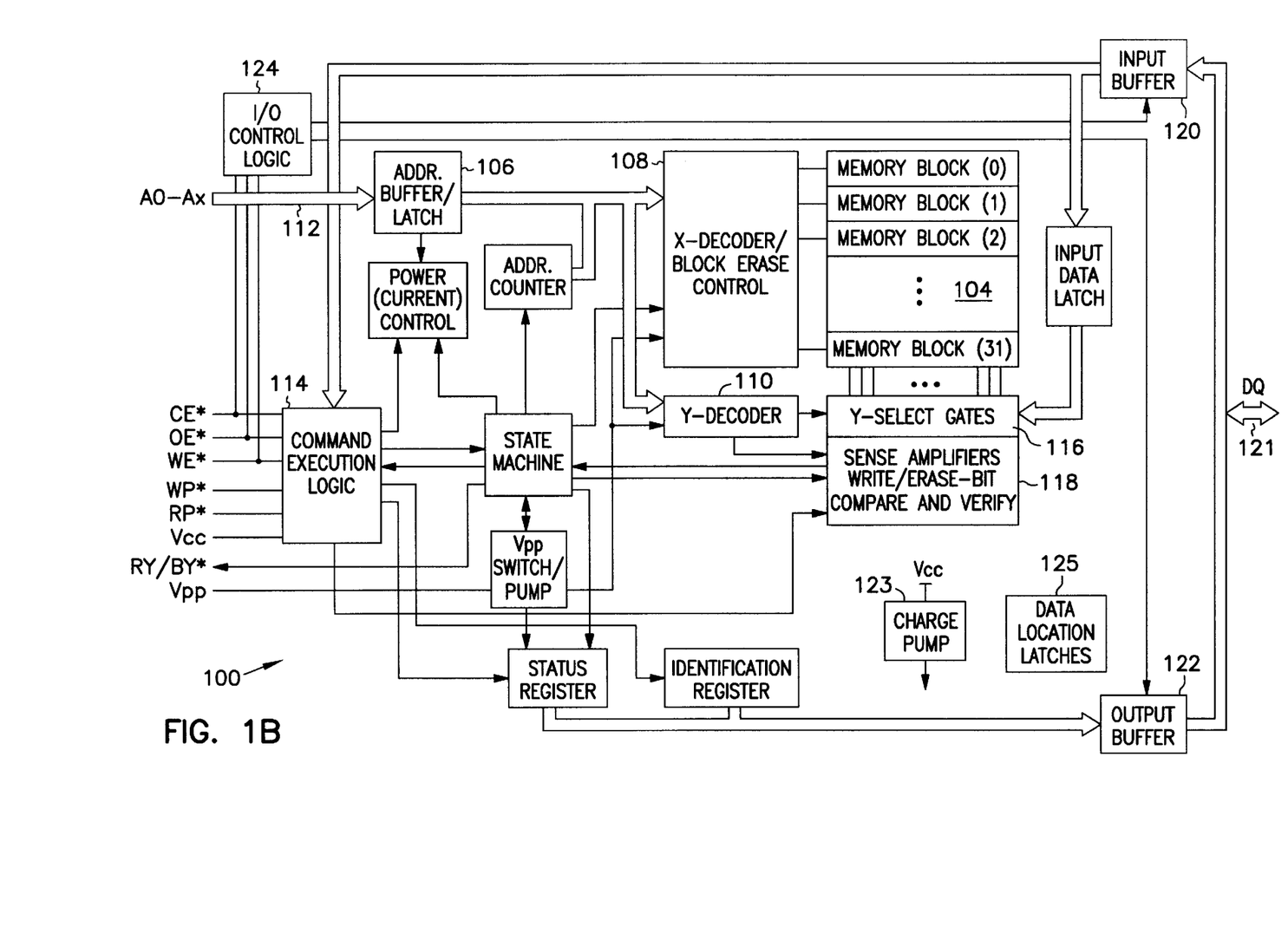
FIG. 1B is a detailed illustration of the flash memory of FIG. 1A.
Figure 1C:
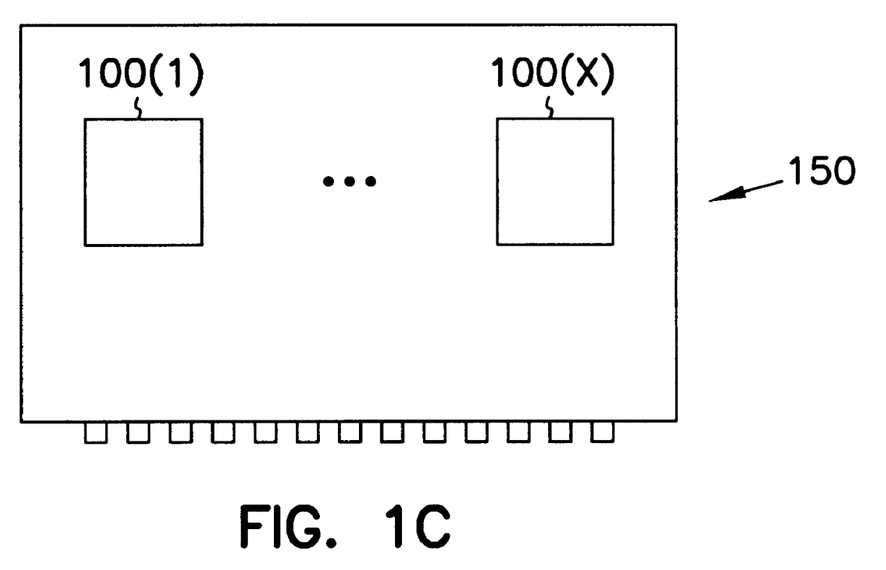
FIG. 1C is a diagram of a memory card including several flash memories of FIG. 1B.

It will be appreciated that more than one Flash memory can be included in various package configurations. For example, compact Flash memory cards 150 can be manufactured in varying densities using numerous Flash memories 100(1)–100(x) as illustrated in FIG. 1C. See "1998 Flash Memory Data Book" pages 3-1 to 3-3 available from Micron Quantum Devices, Inc. (incorporated herein by reference) for a more detailed description of a Flash memory card.

Figure 2:
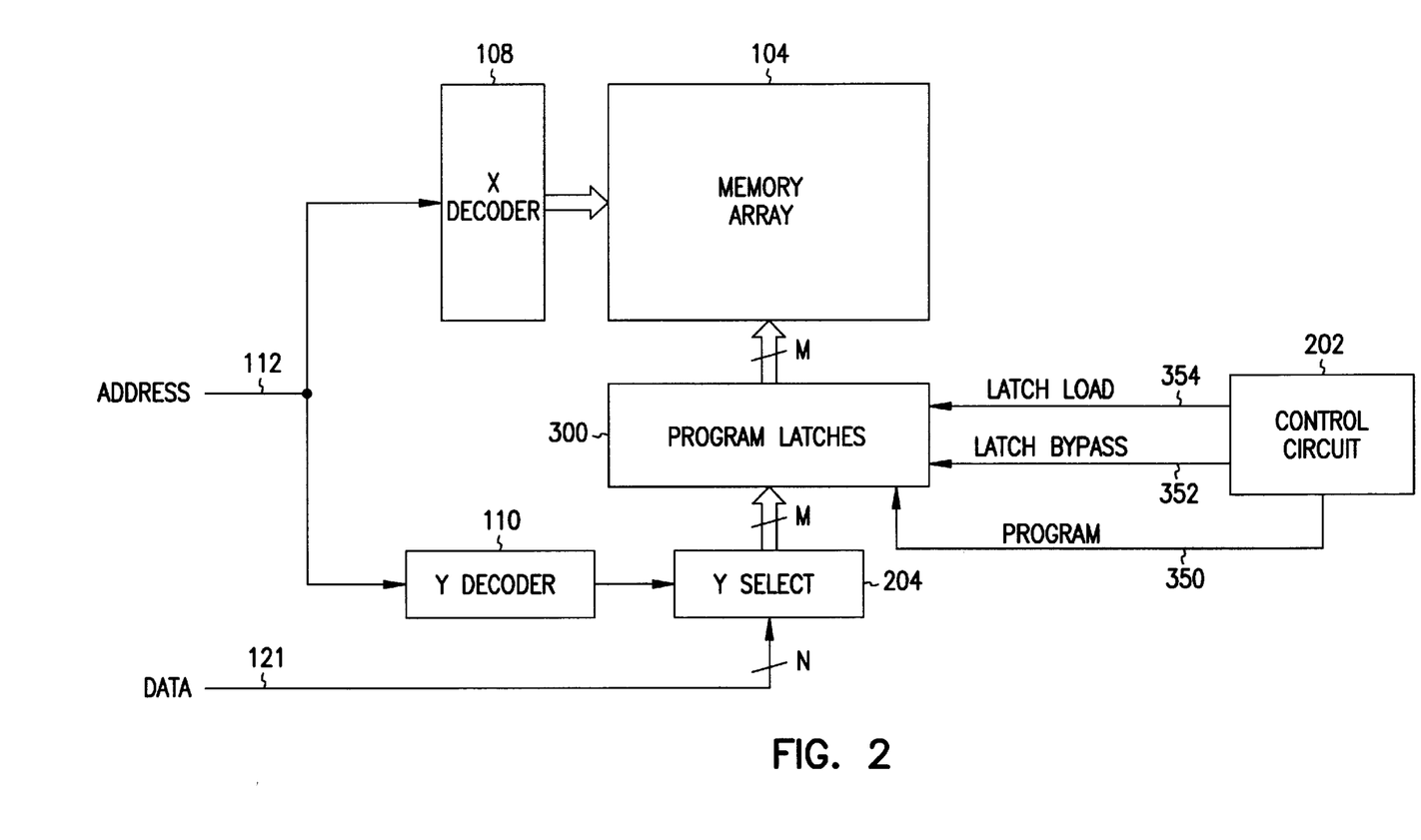
FIG. 2 is a block diagram of a memory device incorporating program latches.

FIG. 2 shows a simplified diagram of memory device. The diagram of the memory as shown in FIG. 2 accentuates the operation of program latches 300. Address signals on address bus 112 drive input nodes of x-decoder 108 and y-decoder 110 as shown in FIG. 1B. Data signals on data bus 121 drive input nodes of y-select 204, as do signals on the output of y-decoder 110. Data bus 121 is N bits wide. N represents the width of the data bus at the memory device boundary. The device boundary is the physical boundary at which the memory is accessed in a processing system. For example, a microprocessor accesses the memory at the device boundary.

The output bus of y-select 204 is M bits wide. M represents the width of memory array 104. Stated differently, memory array 104 is arranged with M columns. Y-select 204 can drive the M output lines with active signals, or can present a high impedance on the M output lines, in any combination depending on signals input from y-decoder 110. When certain ones of program latches 300 are to be loaded, y-select 204 presents active signals on the output lines corresponding to those latches to be loaded. Program latches 300 receive the data signals from y-select 204, and also receive controls signals from control circuit 202. Program latches 300 receive a latch load signal on latch load line 354, a latch bypass signal on latch bypass line 352, and a program signal on program line 350. The control signals received from control circuit 202 are desirably fanned across all latches included within program latches 300, as is further explained with reference to the remaining figures.

Program Latches

Figure 3:
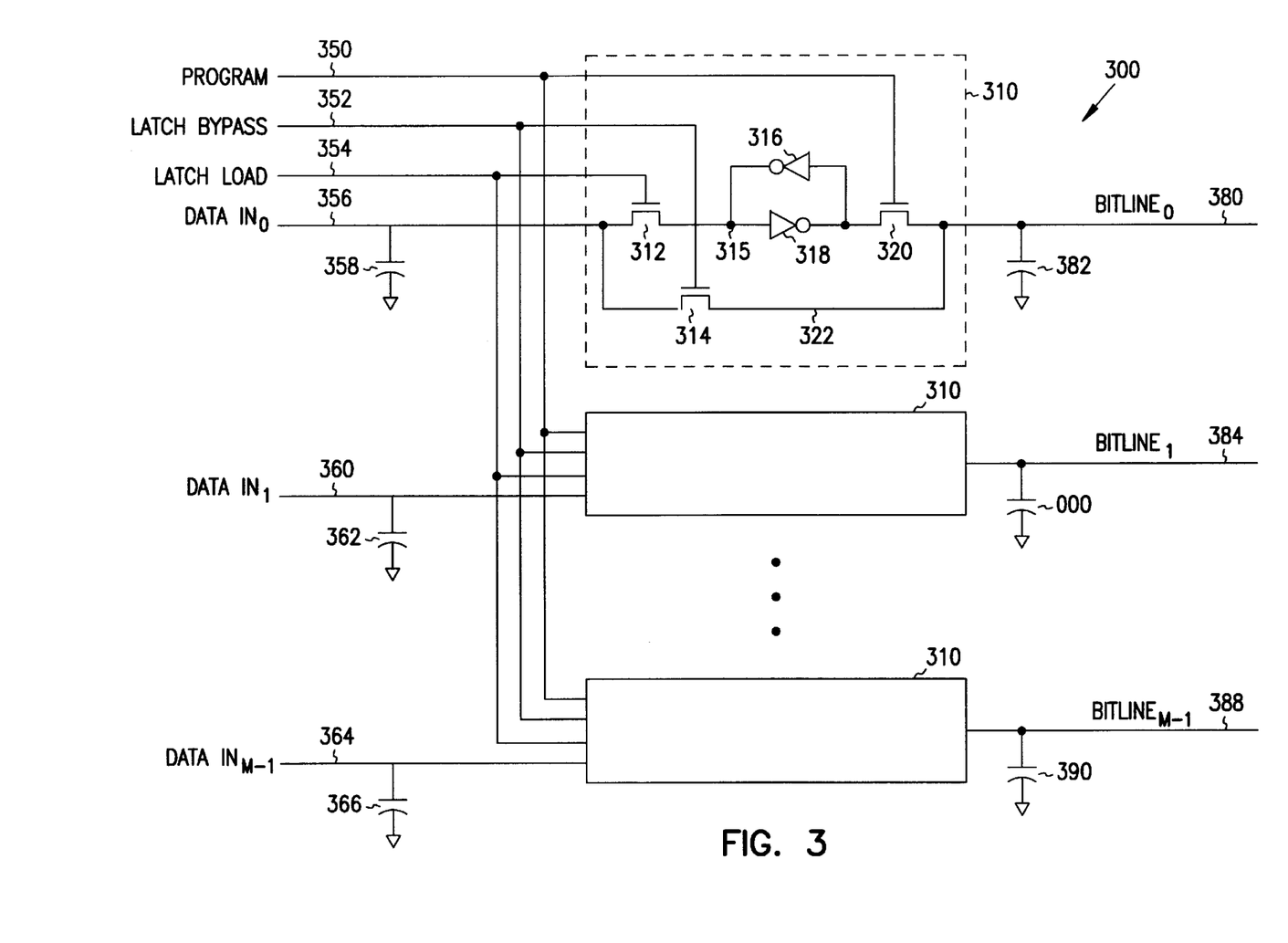
FIG. 3 is a block diagram of a bank of program latches.

FIG. 3 shows a bank of program latches. The bank includes a number of program latches 310. For exemplary purposes, FIG. 3 shows M number of latches 310 to signify that any number can exist. Each program latch includes a storage element made up of a pair of cross-coupled inverters which hold the data that is latched. When the latch is holding data, main path inverter 318 and feedback inverter 316 are stable. Feedback inverter 316 is generally weaker in drive strength than main path inverter 318 so that the drive of feedback inverter 316 can be readily overcome when changing the state of the latch. It will be appreciated that other types of storage elements can be substituted for the cross-coupled inverters while still practicing the present invention.

Program latch 310 also includes latch load transistor 312, latch bypass transistor 314, and program transistor 320. These transistors are pass transistors which can be "on" or "off" depending on the voltage of the gate. The latch load signal on latch load line 354 controls the gate voltage of latch load transistor 312, the latch bypass signal on latch bypass line 352 controls the gate voltage of latch bypass transistor 314, and the program signal on program line 350 controls the gate voltage of program transistor 320. Latch bypass transistor 314 is part of latch bypass path 322 which couples the data input to the bitline on the output. Latch bypass transistor 314 is a bypass element that bypasses the latch, and one skilled in the art will recognize that other types of bypass elements can be substituted for bypass transistor 314 while still practicing the present invention.

Also shown in FIG. 3 are data inputs 0 through M-1, and bitlines 0 through M-1. The signals present on the data inputs are output from y-select 204 as shown in FIG. 2. Capacitors 358, 362, and 366 are shown in FIG. 3 to signify the capacitance of the y-select output circuitry. The bitlines traverse the memory array in the y direction such that each bitline traverses a portion of a column, or an entire column, of the memory array, and the capacitance of the bitlines due to the portion of the array traversed is shown in FIG. 3 as bitline capacitances 382, 386, and 390. The bitline capacitance is generally much larger than the y-select output capacitance.

Each program latch has a dedicated data input line, and a dedicated bitline output. The other signal lines which are input to the program latches, however, are shared. Latch load line 354, latch bypass line 352, and program line 350 are all fanned across the bank of program latches 300. The need for latch load decoding circuitry is obviated because all latch load transistors 312 are activated simultaneously across the bank of program latches.

FIG. 3 shows M latches in number, where M can be any number. For exemplary purposes, the operation of program latches 300 is herein described with M equal to 256, and N equal to 8. This corresponds to a memory device having 256 columns in the array, with one latch per column, and an 8 bit external data path. In operation, the bank of program latches 300 is completely loaded after 32 load operations of 8 bits each. For the purposes of each load operation, the bank of program latches 300 is divided into two subsets, the first being the set to be loaded which consists of 8 latches, and the second set being the set not to be loaded which consists of the remaining 248 latches. The program signal on program line 350 remains de-asserted during all 32 load operations, thereby isolating the bitline capacitances from the latch contents.

The term "load operation" as used herein refers to a load cycle in which a particular latch is loaded. This corresponds to the assertion of the latch load signal and the latch bypass signal, and also corresponds to the latch data input being driven with data. During a load operation, the storage element in the latch may or may not change state depending on the previous contents of the latch. The term "false load operation" as used herein refers to a load cycle in which a particular latch is not loaded. This corresponds to the assertion of the latch load signal and the latch bypass signal, but in contrast to a load operation, during a false load operation, the data input is floating. During a false load operation, the contents of the latch are not modified.

Figure 4:
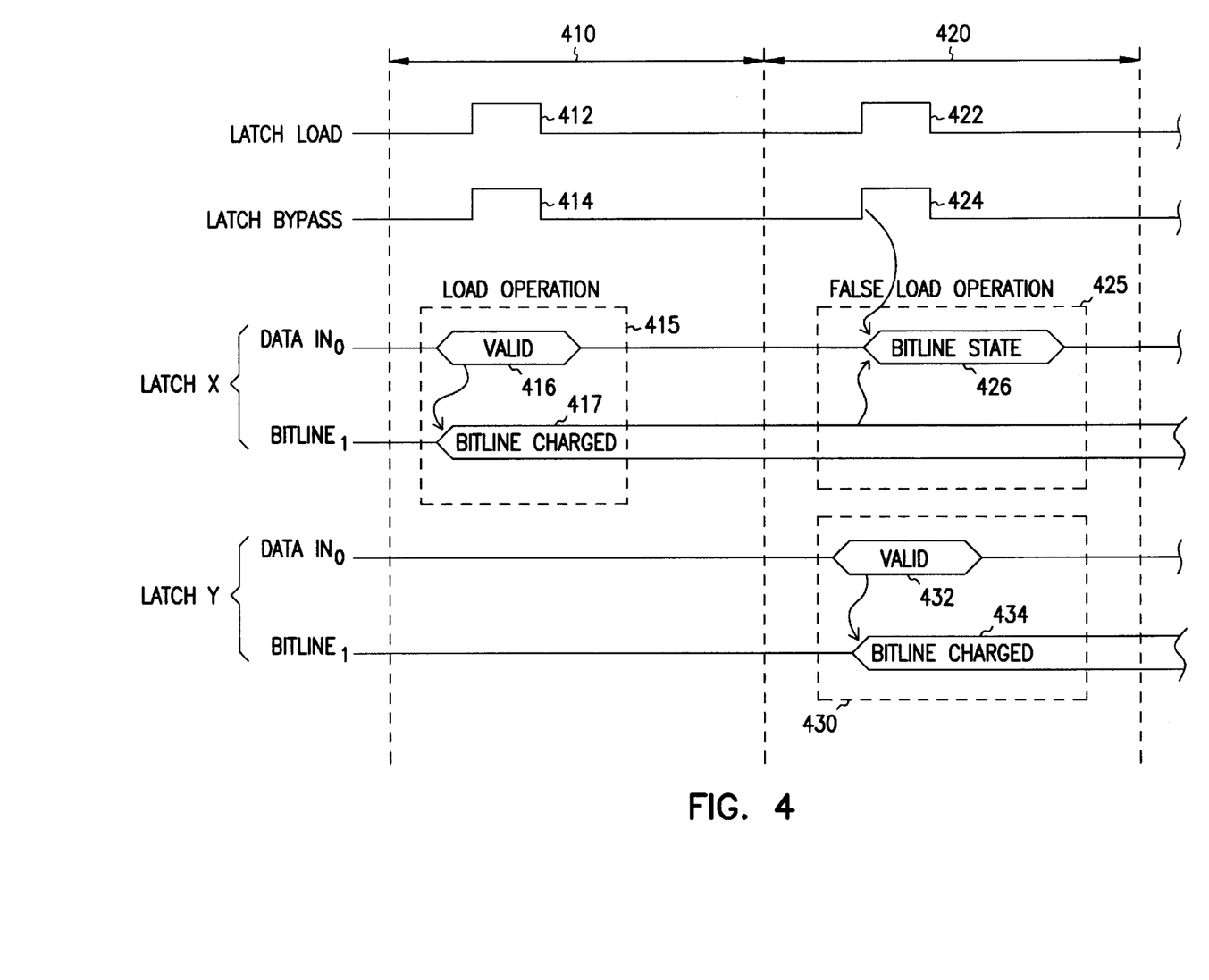
FIG. 4 is a timing diagram showing the operation of program latches.

The latch load operation is described below with reference to the latches shown in FIG. 3 and to the timing diagram shown in FIG. 4. FIG. 4 show the first two of 32 cycles, cycle 410 and cycle 420. In this example, the program latch of interest (latch X) undergoes a load operation during cycle 410, and then undergoes a false load operation in cycle 420. Latch Y undergoes a load operation in cycle 420. When latch X undergoes a load operation, y-select 204 applies data to the data input. This is shown by valid data 416 in load operation 415. Then, with the data input driven, the latch load signal is asserted at 412 and the latch bypass signal is asserted at 414. These control signal assertions turn on latch load transistor 312 and latch bypass transistor 314 in latch X. With latch load transistor 312 on, the valid data on the data input (which is the y-select output) overcomes the drive of feedback inverter 316, and changes the state of latch X if the current logic state of the latch is different from that which is being loaded. With latch bypass transistor 314 on, the signal on the data input also charges the bitline capacitance as shown in FIG. 4 at 417.

The order of application of data, latch load, and latch bypass can be different from that previously described. For example, the data input can be driven by the y-select 204 after the assertion of either or both of the latch bypass and latch load signals. After the load operation in cycle 410, the latch load signal and the latch bypass signal are de-asserted, thereby turning off latch load transistor 312 and latch bypass transistor 314. The storage element is in a steady-state, and the bitline capacitance is charged to the state of the data input during the latch load operation.

In the next load cycle, shown as cycle 420 in FIG. 4, latch Y undergoes a load operation, while latch X undergoes a false load operation. Load operation 430 operates during cycle 420 in the same fashion that load operation 415 operated during cycle 410. That is, valid data is present on the input at 432, and the corresponding bitline is charged at 434. During false load operation 425, latch X has its latch load transistor 312 and latch bypass transistor 314 turned on at 422 and 424 respectively, but without data present on the input. The data input is floating because y-select 204 is not driving the line. During the false load operation, input node 315 of latch X is coupled to the floating data input by virtue of latch load transistor 312 being on. Along with input node 315, the bitline of latch X is coupled to the data input node by virtue of latch bypass transistor 314 being on. The bitline capacitance, which was charged in the load operation, overcomes the y-select output capacitance, and provides charge sharing immunity despite the fact that the data input is floating. This is shown in FIG. 4 at 426. After the bank of program latches 300 is fully loaded, program signal 350 is asserted to apply the latch contents to the bitlines for programming of the device.

In the previous operational description, the latch load signal and the latch bypass signal are both asserted during every load cycle. In an alternate embodiment, the same signal is used for both the latch load signal and the latch bypass signal, thereby saving resources and maintaining operation as previously described. In this alternate embodiment, the gates of latch load transistor 312 and latch bypass transistor 314 can be coupled directly at the program latches, or their respective control lines can be coupled within control circuit 202 (FIG. 2).

In yet another alternate embodiment, latch load line 354 and latch bypass line 352 are not coupled, and can be asserted separately by control circuit 202. This is useful for many purposes including, but not limited to, charging the bitline capacitance without loading the latch, reading back the charge state of the bitline, reading back the latch contents, and programming the latch without charging the bitline.

FIG. 3 has been shown and described in a simplified manner to accentuate the operation of the program latches. It will be appreciated that additional circuitry commonly included in memory devices has been omitted from FIG. 3 for exemplary purposes.

Figure 5:
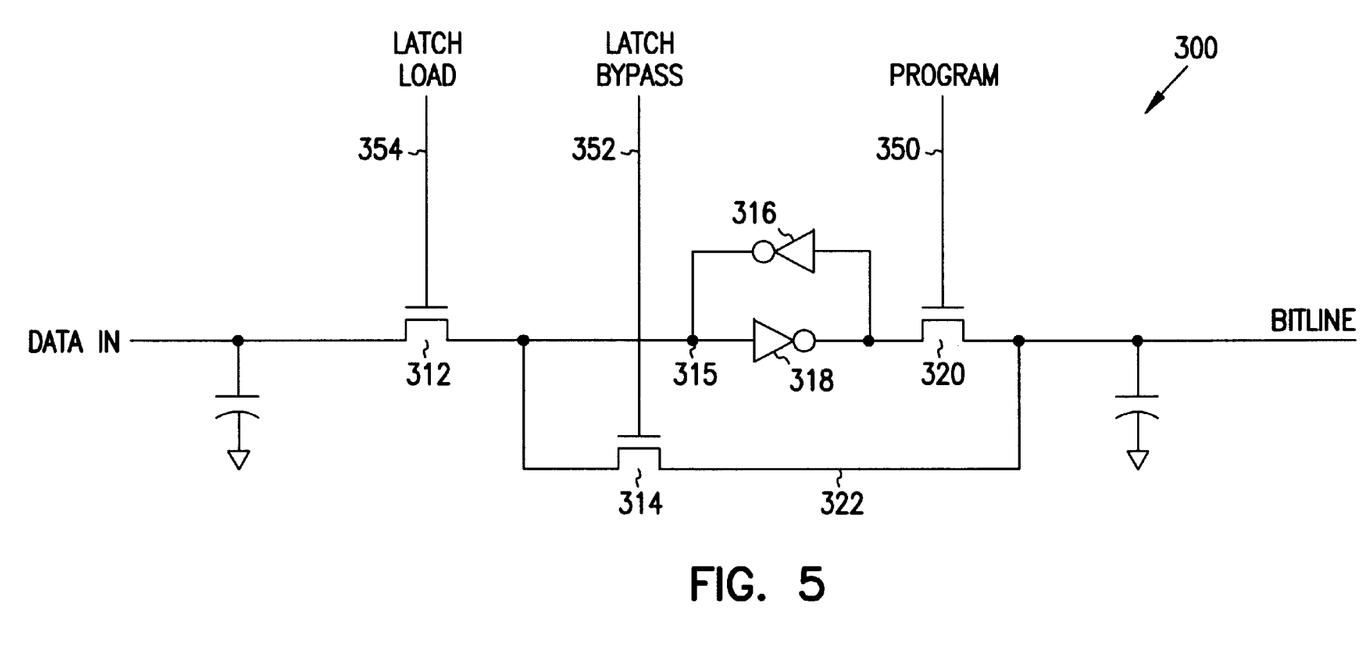
FIG. 5 is a block diagram of an alternate embodiment of a program latch.

FIG. 5 shows an alternate embodiment of a program latch. In the embodiment of FIG. 5, latch bypass transistor 314 is coupled from input node 315 to the bitline, rather than from the data input to the bitline as shown in FIG. 3. The operation of the embodiment of FIG. 5 is the same as that of the embodiment of FIG. 3, except that the bitline is charged from input node 315 rather than the data input.

CONCLUSION

A method and apparatus for loading program latches in parallel while providing charge sharing immunity has been described. A latch is bypassed while it is loaded, thereby coupling the input node to the output node, so that any capacitance on the output is charged. In later load operations, when the input node to the latch is not driven with data, but is rather left to float, the output node is again coupled to the input node so that the charged capacitance on the output keeps the input from changing state. The program latches can be used as part of a memory device, to hold data on shared bitlines in columns of a memory array while the array is programmed. The program latches are controlled by a latch load signal and a latch bypass signal, both of which are fanned out across the bank of program latches. The latches can also be part of a memory that is used in a processing system. The processing system typically includes a processor that accesses the memory device at the memory device boundary, and the processor typically loads a subset of the latches at a time. The size of the subset is generally limited by the width of the data bus at the memory device boundary.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit comprising:
    a latch having an input node and an output node, the output node having a capacitive load thereon; and
    a latch bypass path coupled to the input node of the latch and to the output node of the latch, the latch bypass path being operative to charge the capacitive load on the output node.

2. The integrated circuit of claim 1 wherein the latch bypass path includes a latch bypass transistor.

3. The integrated circuit of claim 1 wherein the latch is comprised of:
    a storage element coupled to the output node; and
    a latch load transistor coupled between the input node and the storage element.

4. The integrated circuit of claim 3 wherein the latch bypass path includes a latch bypass transistor.

5. The integrated circuit of claim 4 wherein a gate of the latch load transistor and a gate of the latch bypass transistor are coupled together.

6. The integrated circuit of claim 3 wherein the storage element is comprised of:
    a main path inverter having a first drive strength; and
    a feedback inverter having a second drive strength.

7. The integrated circuit of claim 6 wherein the second drive strength is weaker than the first drive strength.

8. The integrated circuit of claim 1 wherein the latch has a capacitive load on the input node which is less than the capacitive load on the output.

9. An integrated circuit comprising:
    a plurality of latches responsive to a latch load signal, each of the plurality of latches comprising:
        a storage element;
        a latch load transistor coupled to an input of the storage element, the latch load transistor being responsive to the latch load signal; and
        a latch bypass path operative to charge a capacitive load on an output node of the storage element.

10. The integrated circuit of claim 9 wherein the latch bypass path comprises a latch bypass transistor responsive to a latch bypass signal.

11. The integrated circuit of claim 10 wherein the latch load signal and the latch bypass signal are the same signal.

12. A memory device comprising:
    memory cells arranged in M columns where M is an integer, each column having a shared bitline associated therewith;
    N data input lines, where N is an integer; and
    M program latches, N of which are loaded at a time, each program latch having an output node coupled to a separate shared bitline, wherein each program latch comprises:
        a storage element; and
        a bypass element for charging the shared bitline on the respective output node when the program latch is one of N program latches being loaded.

13. The memory device of claim 12 wherein the bypass element is coupled between an input node and an output node of the respective latch, and the bypass element comprises a latch bypass transistor.

14. A memory device comprising:
    a plurality of memory cells arranged in columns, each of the cells in a column being coupled to a shared bitline having a bitline capacitance associated therewith; and
    a plurality of program latches, each having an output coupled to a separate shared bitline, wherein each program latch comprises:
        a storage element; and
        a bypass element coupled between an input and an output of the program latch for charging the shared bitline on the respective output when the program latch is being loaded.

15. The memory device of claim 14 wherein the bypass element, responsive to a latch bypass signal, conditionally couples the respective shared bitline to an input of the respective program latch.

16. The memory device of claim 14 wherein the bypass element, responsive to a latch bypass signal, charges the respective shared bitline when the respective program latch is loaded.

17. A memory device comprising:
    a plurality of memory cells arranged in columns, each of the cells in a column being coupled to a shared bitline having a bitline capacitance associated therewith; and
    a plurality of program latches, each having an output coupled to a separate shared bitline, wherein each program latch comprises:
        a storage element:
        a bypass element coupled between an input and an output of the program latch; and
        a latch load transistor coupled between the input of the program latch and an input of the storage element, wherein the latch load transistor, responsive to a latch load signal, couples the input of the program latch to the input of the storage element.

18. The memory device of claim 17 wherein all of the latch load transistors in the plurality of program latches are responsive to the same latch load signal.

19. A processing system comprising:
    a processor; and
    a memory device coupled to the processor, the memory comprising memory cells arranged in columns, each of the cells in a column being connected to a shared bitline having a bitline capacitance associated therewith, the memory device comprising:
        a plurality of program latches, each having an output coupled to a separate shared bitline, wherein each program latch comprises:

a storage element; and a bypass element coupled between an input node and an output node of the program latch for charging the shared bitline on the respective output node when the program latch is being loaded.

20. The processing system of claim 19 wherein the bypass element, responsive to a latch bypass signal, conditionally couples the respective shared bitline to an input node of the respective program latch.

21. The processing system of claim 19 wherein the bypass element, responsive to a latch bypass signal, charges the respective shared bitline when the respective program latch is loaded.

22. A processing system comprising:

a processor; and a memory device coupled to the processor, the memory comprising memory cells arranged in columns, each of the cells in a column being connected to a shared bitline having a bitline capacitance associated therewith, the memory device comprising:

a plurality of program latches, each having an output coupled to a separate shared bitline wherein each program latch comprises:

a storage element;

a bypass element coupled between an input node and an output node of the program latch; and a latch load transistor coupled between the input node of the program latch and an input node of the storage element, wherein the latch load transistor, responsive to a latch load signal, couples the input node of the program latch to the input node of the storage element.

23. The processing system of claim 22 wherein all of the latch load transistors in the plurality of program latches are responsive to the same latch load signal.

24. A method of operating a latch which has a capacitive input load and a capacitive output load, comprising:

coupling a storage element within the latch to the capacitive input load; and coupling the capacitive input load to the capacitive output load.

25. The method of claim 24 further comprising:

driving an input of the latch with a data signal, thereby charging the capacitive input load and the capacitive output load.

26. The method of claim 24 wherein the capacitive output load is larger than the capacitive input load, the method further comprising:

not driving an input of the latch, thereby allowing a charge state of the capacitive output load to determine a charge state of the capacitive input load.

27. In a system including a plurality of latches, each having a capacitive output load thereon, and each being conditionally coupled to a separate data input, the plurality of latches being comprised of a set of latches to be loaded and a set of latches not to be loaded, a method of loading the set of latches to be loaded, comprising:

coupling the plurality of latches to their respective data inputs;

coupling the capacitive output load of each of the plurality of latches to their respective data inputs; and driving with data the data inputs corresponding to the set of latches to be loaded.

28. The method of claim 27 further comprising:

not driving with data the data inputs corresponding to the set of latches not to be loaded.

29. The method of claim 27 wherein the set of latches to be loaded is comprised of one latch.

30. The method of claim 27 wherein the set of latches to be loaded is smaller than the set of latches not to be loaded.

31. The method of claim 27 wherein the set of latches to be loaded is the same size as the set of latches not to be loaded.

32. The method of claim 27 wherein the set of latches to be loaded is larger than the set of latches not to be loaded.

* * * * *